United States Patent [19]

Wu et al.

[11] Patent Number: 4,777,389

[45] Date of Patent: Oct. 11, 1988

[54] OUTPUT BUFFER CIRCUITS FOR REDUCING GROUND BOUNCE NOISE

[75] Inventors: Bor-Tay Wu; Wayne W. Yip Wong, both of Sunnyvale, Calif.

[73] Assignee: Advanced Micro Devices, Inc., Sunnyvale, Calif.

[21] Appl. No.: 85,104

[22] Filed: Aug. 13, 1987

[51] Int. Cl.$^4$ .......................................... H03K 19/003
[52] U.S. Cl. .................... 307/443; 307/448; 307/451; 307/475; 307/263
[58] Field of Search .............. 307/443, 448, 451, 475, 307/263, 270, 547–548, 554, 557

[56] References Cited

U.S. PATENT DOCUMENTS

| | | | |
|---|---|---|---|
| 4,567,378 | 1/1986 | Raver | 307/263 X |
| 4,622,482 | 11/1986 | Ganger | 307/263 X |
| 4,638,187 | 1/1987 | Boler et al. | 307/451 |
| 4,645,952 | 2/1987 | van Tran | 307/451 X |
| 4,719,369 | 1/1988 | Asano et al. | 307/263 X |
| 4,724,340 | 2/1988 | Sood | 307/443 |
| 4,725,747 | 2/1988 | Stein et al. | 307/443 X |
| 4,727,266 | 2/1988 | Fujii et al. | 307/443 |
| 4,731,553 | 3/1988 | Van Lehn et al. | 307/451 X |
| 4,739,193 | 4/1988 | Doty, II | 307/443 |

Primary Examiner—Stanley D. Miller
Assistant Examiner—D. R. Hudspeth
Attorney, Agent, or Firm—Davis Chin; J. Vincent Tortolano

[57] ABSTRACT

An output buffer includes a pull-up transistor (N1), a first pull-down transistor (N3), a second pull-down transistor (N8), and a logic circuit (15). The logic circuit (15) is responsive to a data input signal making a high-to-low transition and the output signal making a high-to-low transition for maintaining the second pull-down transistor (N8) turned-off until after an output node has made the high-to-low transition, thereby reducing significantly the ground bounce noise.

20 Claims, 5 Drawing Sheets

OUTPUT BUFFER CIRCUITS FOR REDUCING GROUND BOUNCE NOISE

BACKGROUND OF THE INVENTION

This invention relates generally to integrated circuits and more particularly, it relates to output buffer circuits for reducing significantly ground bounce noise.

As is well known, digital logic circuits are widely used in the electronics field. One such use is for the interfacing between the logic of one integrated circuit device and another integrated circuit device. An output buffer circuit is an important component for this interface function. The output buffer provides, when enabled, an output signal which is a function of data signal received from other logic circuitry of the integrated circuit.

Output buffer circuits typically use a pull-up fieldeffect transistor (FET) and a pull-down field-effect transistor connected to an output terminal. Depending upon the state of the input data signal and an enable signal, either the pull-up or pull-down field-effect transistor is quickly turned on and the other one of them is turned off.

In general, the output buffer circuits of the prior art have not been capable of providing output drive current of the magnitude possible with bipolar integrated circuits. There have been attempts made to achieve higher output drive currents from output buffers by increasing the size of the pull-down field-effect transistor to approximately twice the size of the pull-up field-effect transistor. However, this has resulted in sacrifices in speed and output signal distortion due to the large instantaneous current, when the pull-down transistor is turned on, flowing through the impedance and inductance components of the power supply lines to cause inductive noise at the internal ground potential node of the output buffer.

It would therefore be desirable to provide improved output buffer circuits which have a high current drive capability comparable to the bipolar integrated circuits but yet reduces significantly the distortion in the output signal due to ground bounce noise. The output buffer circuits of the present invention include a first pull-down transistor having a size equal to the size of the pull-up transistor and a second pull-down transistor having a larger size to accommodate the high current drive capability. The reduction in the bounce noise is achieved by delaying the turn-on of the second larger pull-down transistor until after the output has reached the low or logic "0" level.

SUMMARY OF THE INVENTION

Accordingly, it is a general object of the present invention to provide improved output buffers which are relatively simple and economical to manufacture and assemble, but yet overcomes the disadvantages of the prior art output buffers.

It is an object of the present invention to provide an improved output buffer which has a significant reduction in ground bounce noise.

It is another object of the present invention to provide an improved output buffer which includes a first pull-down transistor having a size equal to the size of the pull-up transistor and a second pull-down transistor having a larger size to accommodate the high current drive capability.

It is still another object of the present invention to provide an improved output buffer which includes a first pull-down transistor, a second pull-down transistor, and a logic gate device for delaying the turn-on of the second pull-down transistor until after the output has reached the low logic level.

In accordance with these aims and objectives, the present invention is concerned with the provision of an improved output buffer for producing an output signal at an output node which has a significant reduction in ground bounce noise which includes a pull-up transistor circuit, a pull-down transistor circuit, a first logic circuit, a second logic circuit, and a third logic circuit. The pull-up transistor circuit is responsive to a first control signal for generating slowly a transition from a low logic level to a high logic level at the output node. The pull-down transistor circuit is responsive to second and third control signals for generating slowly a transition from the high logic level to the low logic level at the output node. The pull-up circuit includes a pull-up transistor having one of its main electrodes coupled to a first power supply terminal, its other main electrode coupled to the output node, and its control electrode coupled to receive the first control signal. The pull-down circuit includes a first pull-down transistor having one of its main electrodes coupled to a second power supply terminal, its other main electrode coupled to the output node, and its control electrode coupled to receive the second control signal. The pull-down circuit further includes a second pull-down transistor having one of its main electrodes coupled to the second power supply terminal, its other main electrode coupled to the output node, and its control electrode coupled to receive the third control signal.

The first logic circuit is responsive to a data input signal making a low-to-high transition and the output signal making a low-to-high transition for generating the first control signal. The second logic circuit is responsive to the data input signal making a high-to-low transition and the output signal making a high-to-low transition for generating the second control signal. The third logic circuit is responsive to the data input signal making the high-to-low transition and the output signal making the high-to-low transition for maintaining the second pull-down transistor turned-off until after the output node has made the high-to-low transition, thereby reducing significantly the ground bounce noise.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
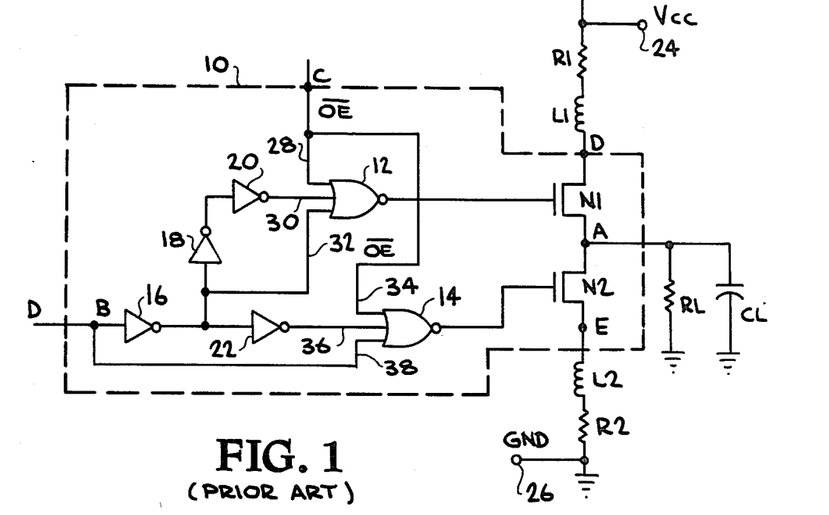
FIG. 1 is a schematic circuit diagram of a prior art output buffer circuit utilizing an N-channel pull-up FET and an N-channel pull-down FET.

Referring now to the drawings, there is shown in FIG. 1 a schematic circuit diagram of a prior art output buffer circuit 10 formed of an N-channel pull-up field-effect transistor (FET) N1 and an N-channel pull-down FET N2. The buffer circuit 10 provides an output signal at an output node A in response to a data input signal D received at data input node B and an enable signal $\overline{OE}$ received at enable input node C. The buffer circuit 10 includes NOR logic gates 12, 14 and inverters 16, 18, 20, 22. power for all of the components of the buffer circuit 10 is provided by first external and second external power supply terminals 24, 26. A first supply potential VCC is supplied at the first terminal 24, and a second supply or ground potential GND is applied at the second terminal 26.

The output node A of the buffer circuit 10 is used to drive a capacitive load formed of a resistance $R_L$ and a capacitor $C_L$. The first external power supply terminal 24 is connected to an internal supply potential node D via a series-connected resistor R1 and inductor L1 which represent the impedance and inductance components in the power supply line. Similarly, the second external power supply terminal 26 is connected to an internal ground potential node E via a series-connected resistor R2 and inductor L2 which represent the impedance and inductance components in the power supply line.

The NOR gate 12 receives the enable signal $\overline{OE}$ on line 28, the inverted or complement of the data input signal D on line 30, and the complement of the data input signal D on line 32. The data input signal D is inverted three times via the inverters 16, 18 and 20 to produce the inverted data input signal $\overline{D}$ on the line 30. The data input signal D is also inverted once by the inverter 16 to produce the inverted data input signal $\overline{D}$ on the line 32. The output of the NOR gate 12 is supplied to the gate of the pull-up transistor N1.

The NOR gate 14 receives the same enable signal $\overline{OE}$ on line 34, the non-inverted data input signal D on line 36, the non-inverted data input signal on line 38. The data input signal D is inverted two times via the inverters 16 and 22 to produce the non-inverted data input signal D on the line 36. The data input signal D received at the node B is also fed directly via the line 38 to the input of the NOR gate 14. The output of the NOR gate 14 is supplied to the gate of the pull-down transistor N2.

When the enable signal $\overline{OE}$ is at a low or logic "0" level (GND) and the data input signal D is at a high (VCC) or logic "1" level, the output of the NOR gate 12 will be at the high level and the output of the NOR gate 14 will be at the low level. This causes a logic "1" (VCC) to be applied to the gate of the transistor N1 and a logic "0" (GND) to be applied to the gate of the transistor N2. As a result, the N-channel FET N1 is turned on and the N-channel FET N2 is turned off. Thus, the output node A is pulled up toward the supply potential VCC.

On the other hand, when the enable signal $\overline{OE}$ is at a low or logic "0" level (GND) and the data input signal D is at a low (GND) or logic "0" level, the output of the NOR gate 12 will be at the low level and the output of the NOR gate 14 will be at the high level. This causes a logic "0" (GND) to be applied to the gate of the transistor N1 and a logic "1" (VCC) to be applied to the gate of the transistor N2. As a result, the output node A is pulled down toward the ground potential.

When the enable signal $\overline{OE}$ is at the high or logic "1" level (VCC), the outputs of both NOR gates 12 and 14 are at the logic "0", causing both N-channel transistors N1 and N2 to be turned off. This produces a high impedance tri-state mode at the output node A in which the output buffer circuit 10 is not enabled.

In order to increase the magnitude of the drive current in the output buffer circuit 10 so as to be equal to the prior art bipolar output buffers, the physical size of the pull-down transistor N2 is made to be approximately twice the size of the pull-up transistor N1. As a consequence, the turning-on of the transistor N2 will generate a large instantaneous current flowing into the inductive L2 which will cause voltage variations producing ground bounce noise at the internal ground potential node E. Also, the turning-on of the transistor N1 will generate a similar instantaneous current flowing into the inductive L1 which will cause voltage variations producing output signal ringing at the internal supply potential node D. However, the fluctuation at the node D will be smaller than the ones at the node E. Therefore, it can be seen that the high drive current can be achieved with the output buffer circuit 10 only at the expense of sacrificing speed and an increase in output signal distortion due to internal ground bounce noise and/or output signal ringing.

Figure 2:
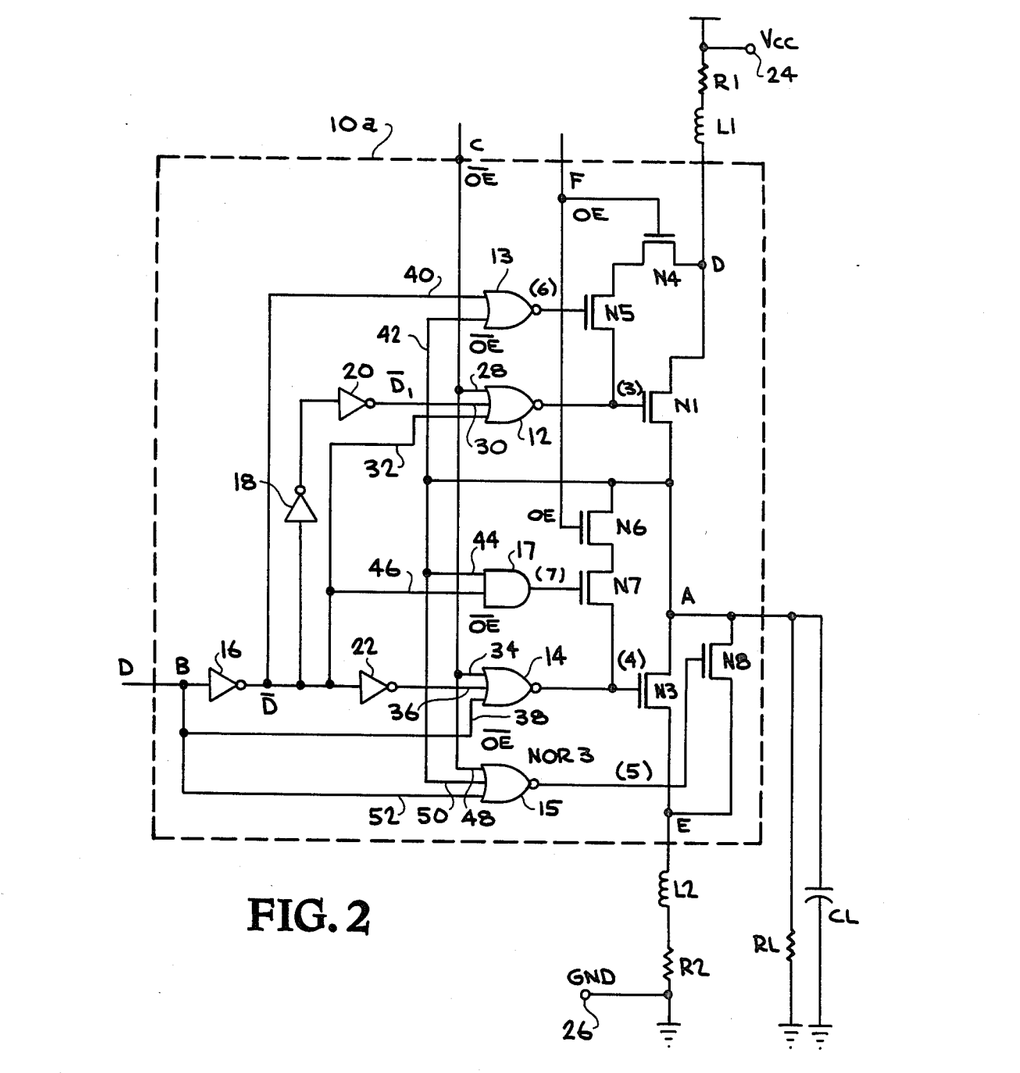
FIG. 2 is a schematic circuit diagram of an output buffer circuit constructed in accordance with the principles of the present invention.

In FIG. 2, there is shown an output buffer circuit 10a of the present invention which represents an improvement over the buffer circuit 10 of FIG. 1. The output buffer circuit 10a provides a high current drive capability comparable to the bipolar I.C. but yet reduces significantly the distortion in the output signal due to ground bounce noise. The output buffer circuit 10a provides an output signal at an output node A in response to a data input signal D received at data input node 8 and a first enable signal $\overline{OE}$ received at enable input node C and a second enable signal OE received at enable input node F.

The output buffer circuit 10a includes NOR logic gates 12, 13, 14, 15; inverters 16, 18, 20, 22; AND logic gate 17; enable transistors N4, N6; control transistors N5, N7; a pull-up transistor N1; and first and second pull-down transistors N3, N8. The power for the buffer circuit 10a is provided by first external and second external power supply terminals 24 and 26. A first power supply potential VCC is applied at the first terminal 24 and a second supply or ground potential GND is applied at the second terminal 26.

The NOR gate 12 receives the enable signal $\overline{OE}$ on line 28, the inverted or complement of the data input signal D on line 30, and the complement of the data input signal D on line 32. The data input signal D is inverted three times via the inverters 16, 18 and 20 to produce the inverted data input signal $\overline{D}$ on the line 30. The data input signal D is also inverted once by the inverter 16 to produce the inverted data input signal $\overline{D}$ on the line 32. The output of the NOR gate 12 is supplied to the gate of the pull-up transistor N1 at node 3.

The NOR gate 14 receives the same enable signal $\overline{OE}$ on line 34, the non-inverted data input signal D on line 36, and the non-inverted data input signal D on line 38. The data input signal D is inverted two times via the inverters 16 and 22 to produce the non-inverted data input signal D on the line 36. The data input signal D received at the node 8 is also fed directly via the line 38 to the input of the NOR gate 14. The output of the NOR gate 14 is supplied to the gate of the first pull-down transistor N3 at node 4.

The NOR gate 13 receives the inverted data input signal $\overline{D}$ via the output of the inverter 16 on line 40 and receives the output signal at the output node A on line 42. The output of the NOR gate 13 is supplied to the gate of the control transistor N5 at node 6. The transistor N5 has its drain connected to the source of the enable transistor N4 and its source also connected to the node 3. The enable transistor N4 has its gate connected to the enable signal OE at the node F and its drain connected to the drain of the pull-up transistor N1.

The AND gate 17 receives the output signal at the output node A on line 44 and receives the inverted data signal $\overline{D}$ on line 46. The output of the AND gate 17 is applied to the gate of the control transistor N7 at node 7. The transistor N7 has its drain connected to the source of the enable transistor N6 and its source connected to the node 4. The transistor N6 has its drain connected to the drains of the pull-up transistors N3, N8 or output node A and its gate connected to the second enable signal OE.

The NOR gate 15 receives the first enable signal $\overline{OE}$ on line 48, the output signal at the output node A on line 50, and the data input signal D on line 52. The output of the NOR gate 15 is supplied to the gate of the second pull-down transistor N8. The transistors N3 and N8 have their drain-source conduction paths connected in parallel between the output node A and the internal ground node E. Specifically, the drains of the transistors N3 and N8 are connected to the output node A and the sources thereof are connected to the node E.

Figure 3:
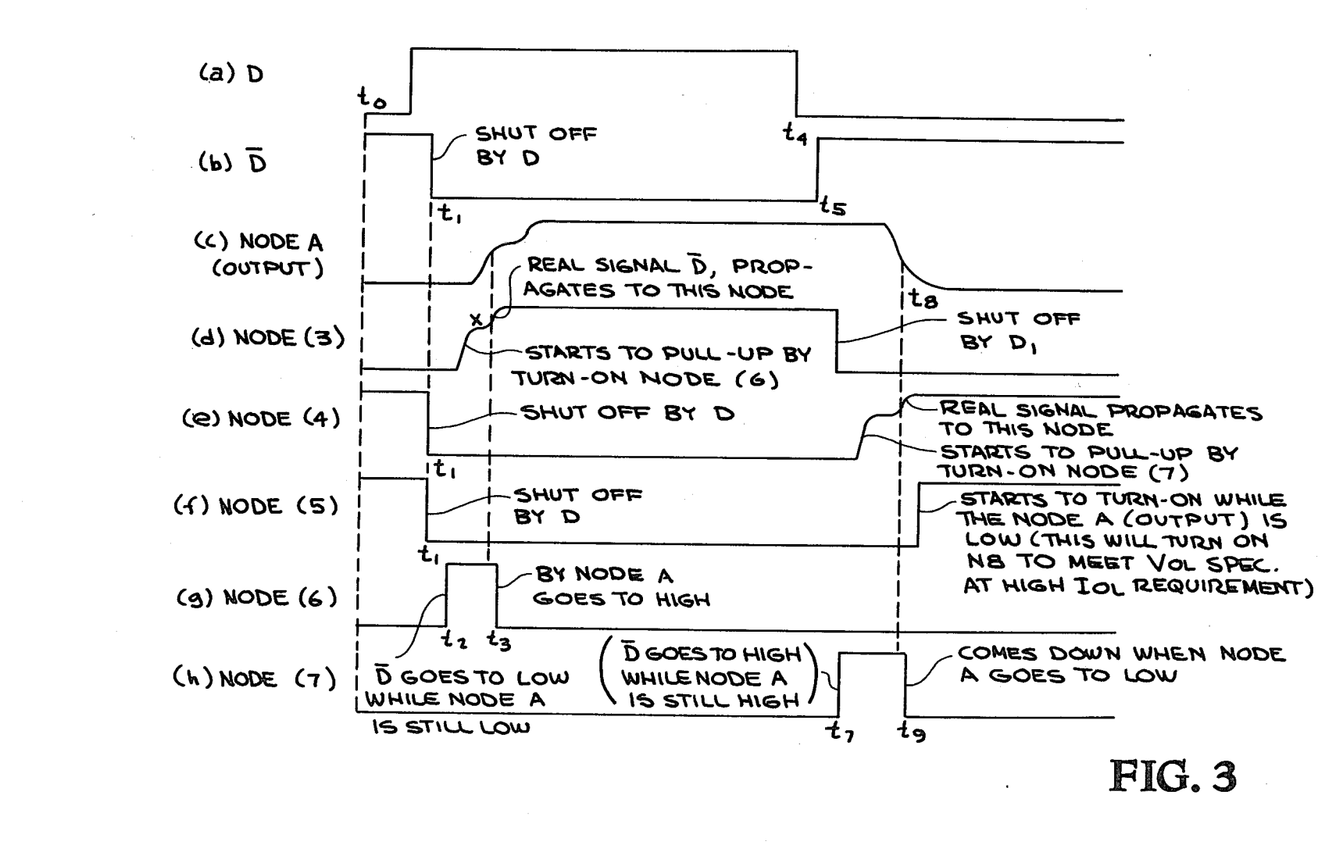
FIGS. 3(a)-3(h) are waveforms at various points in the circuit of FIG. 2.

Reference is now made to FIGS. 3(a)–3(h) of the drawings which illustrate the waveforms appearing at various points in the output buffer circuit 10a of FIG. 2 so as to provide an understanding of the operation of the present invention. The pull-up action of FIG. 2 will now be explained. Initially, it will be assumed that the first enable signal $\overline{OE}$ is low, the second enable signal OE is high, and the output signal at the output node A is low at the time t$\phi$. The waveform of the output node A is shown in FIG. 3(c). Thus, the enable transistors N4 and N6 are both turned on. Further, it will be assumed that the first and second pull-down transistors are both turned on. This is because at the time t$\phi$ the gates (nodes 4 and 5) of the respective transistors N3 and N8 are at the high level. The waveforms at the nodes 4 and 5 are illustrated in respective FIGS. 3(e) and 3(f). At the time t1 when the inverted data $\overline{D}$ makes a high-to-low transition instantaneously (FIG. 3(b)), the transistors N3 and N8 are quickly turned off as can be seen from FIGS. 3(e) and 3(f). However, the output signal at the node A (FIG. 3(c)) still remains at the low level.

As a result, the output of the NOR gate 13 is switched from a low level to a high level at the time t2 as shown in FIG. 3(g). This will cause the control transistor N5 to turn on and thus the node 3 will begin to rise toward the supply potential VCC via the transistors N4 and N5 as depicted in FIG. 3(d). However, the node 3 will only reach the voltage determined by the ratio of the turn-on resistors in the transistors N4 and N5 and the NOR gate 12 since the output of the NOR gate 12 is initially low. This voltage at the node 3 will be below the supply potential VCC. This is shown at point X in FIG. 3(d).

The node 3 will eventually reach the supply potential VCC after the output of the NOR gate 12 has switched from the low level to the high level. As can be seen from FIG. 3(g), the output of the NOR gate 13 will be switched back to the low level at the time t3 after the output node A has gone high. Since the NOR gate 13 and the control transistor N5 are used to turn on slowly the pull-up transistor N1, this reduces the instantaneous pull-up current through the transistor N1 and thus minimizes the noise generated across the series-connected resistor R1 and the inductor L1 which are connected to the supply potential VCC.

The pull-down action of FIG. 2 will now be described. This occurs at the time t5 when the inverted data signal $\overline{D}$ makes a low-to-high transition as is illustrated in FIG. 3(b). As a result, the pull-up transistor N1 will be quickly turned off at the time t6 as shown in FIG. 3(d). Since the output node A will remain high at the time t5, as shown in FIG. 3(c), this causes the output of the AND gate 17 to switch from a low level to a high level at the time t7. This is depicted in FIG. 3(h). As a consequence, the control transistor N7 is turned on and thus the node 4 will begin to rise toward the supply potential VCC as depicted in FIG. 3(e). However, the node 4 will only reach the voltage determined by the ratio of the turn-on resistors in the transistors N6 and N7 and the NOR gate 14 since the NOR gate 14 is initially low. This voltage at the node 4 will be less than the high level voltage at the node A which is less than the supply potential VCC. This is shown at point Y in FIG. 3(e). The node 4 will eventually reach the supply potential VCC after the output of the NOR gate 14 has switched from the low level to the high level. As a result, the output node A, as shown in FIG. 3(c), will be pulled low at the time t8. As can be seen from FIG. 3(h), the output of the AND gate 17 will be switched back to the low level at the time t8 after the output node A has gone low. Only after the output node A is low, the output of the NOR gate 15 at node 5 will start to rise, thereby causing the delayed turn-on of the second pull-down transistor N8.

Since the AND gate 17 and the control transistor N7 are used to turn on slowly the pull-down transistor N3 so as to start tha pull-down action, the instantaneous current through the transistor N3 will be smaller than the current through the transistor N2 of FIG. 1. This is achieved by also splitting the pull-down transistor N2 (FIG. 1) into two transistors N3 and N8. The size of the first pull-down transistor N3 will be made equal to the size of the pull-up transistor N1, and the size of the second pull-down transistor N8 will be of an equal or larger size than the first pull-down transistor N3 in order to provide the high drive capability. It will be noted that the second pull-down transistor N8 will not be turned on until after the output has reached a low level. Thus, the second pull-down transistor is delayed in its turn-on with respect to the turn-on of the first pull-down transistor N3 which reduces significantly the ground bounce noise due to the inductance in the power supply lines.

Figure 4:
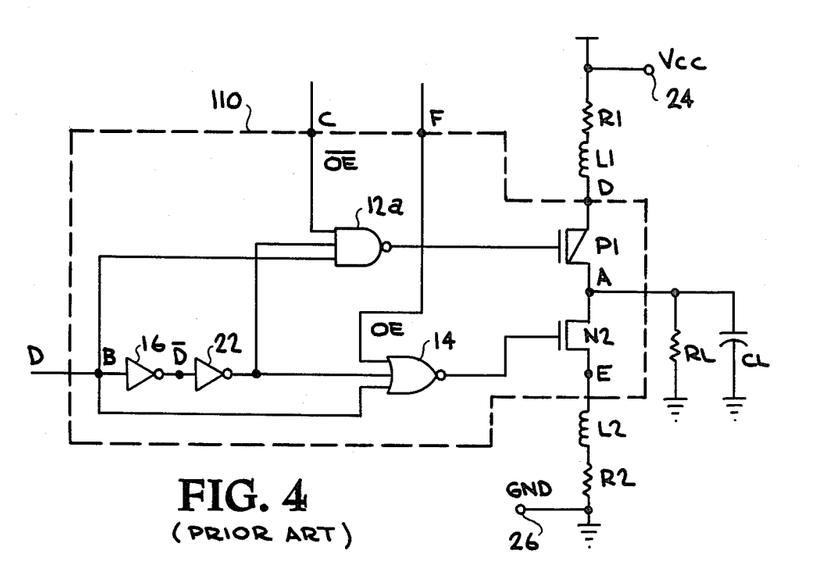
FIG. 4 is a schematic circuit diagram of a prior art CMOS output buffer circuit utilizing a P-channel pull-up FET and an N-channel pull-down FET.

In FIG. 4, there is shown a schematic circuit diagram of a prior art full CMOS output buffer circuit 110 formed of a P-channel pull-up field-effect transistor (FET) P1 and an N-channel pull-down FET N2. The buffer circuit 110 provides an output signal at an output node A in response to a data input signal D received at data input node 8, a first enable signal $\overline{OE}$ received at enable input node C, and a second enable signal OE received at enable input node F. Since the circuit of FIG. 4 is substantially identical to the circuit of FIG. 1, only the differences will now be discussed. The NOR gate 12 in FIG. 1 has been replaced by a NAND gate 12a. Further, the inverters 18 and 20 in FIG. 1 have now been eliminated. Except for these changes, the operation of the circuit in FIG. 4 is substantially identical to the circuit of FIG. 1.

Figure 5:
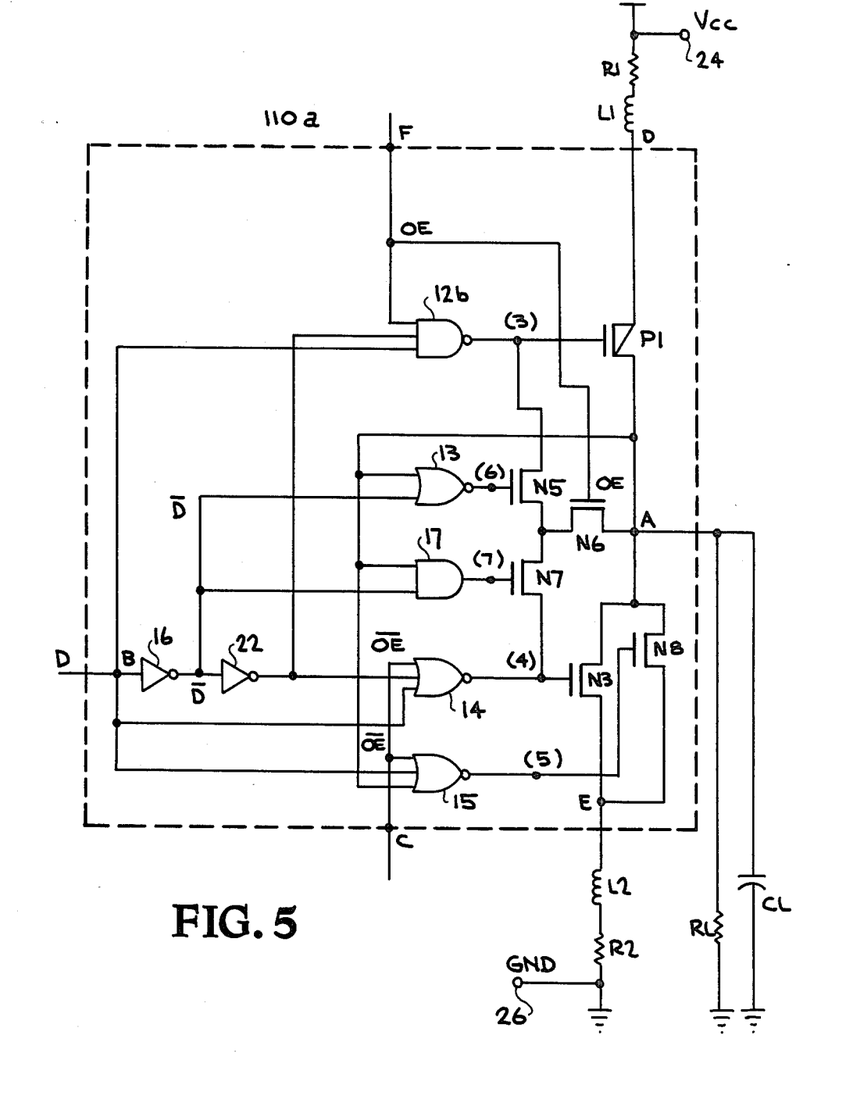
FIG. 5 is a schematic diagram of a second embodiment of the output buffer circuit of the present invention.
Figure 6:
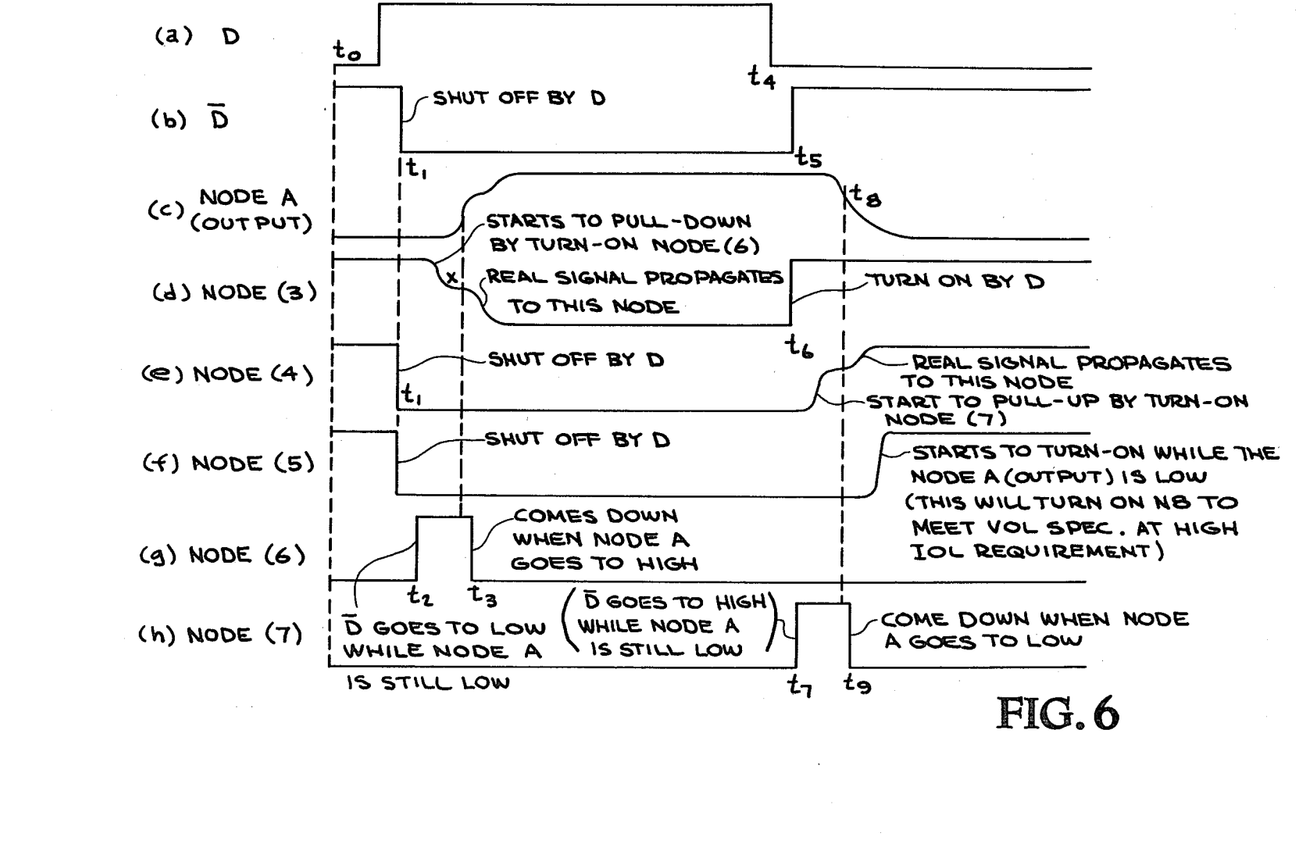
FIGS. 6(a)–6(h) are waveforms at various points in the circuit of FIG. 4.

Referring now to FIG. 5, there is depicted a schematic circuit diagram of an alternate embodiment of an output buffer 110a constructed according to the present invention. The output buffer circuit 110a represents an improvement over the buffer circuit 110 of FIG. 4. The output buffer circuit 110a provides a high current drive capability comparable to the bipolar I.C. but yet reduces significantly the distortion in the output signal due to ground bounce noise. The output buffer circuit 110a provides an output signal at an output node A in response to a data input signal D received at data input node 8, a first enable signal $\overline{OE}$ received at enable input node C, and a second enable signal OE received at enable input node F. The circuit of FIG. 5 is substantially identical to the circuit of FIG. 2, except that the NOR gate 12 of FIG. 2 has been replaced by a NAND gate 12b. Further, the inverters 18 and 20 of FIG. 1 have been eliminated, and the connection of the control transistors N4 and N6 have been modified. The size of the first pull-down transistor N3 is smaller in size than the pull-up transistor P1, and the size of the second pull-down transistor N8 is equal or larger in size than the first pull-down transistor N3.

Except for these changes, the operation of the circuit of FIG. 5 is substantially identical to the circuit of FIG. 2 and thus will not be generally repeated. In FIGS. 6(a)–6(h), there are illustrated waveforms at various points in the circuit of FIG. 5. As can be seen, these waveforms are substantially identical to the waveforms of FIG. 3(a)–3(h) except for FIG. 6(d). This is the waveform at the node 3 or at the gate of the p-channel pull-up transistor P1. As can be seen, this waveform is inverted from the waveform of FIG. 3(d).

While the output buffer circuits 10a and 110a of FIGS. 2 and 5 have been shown with enable transistors, it should be understood by those skilled in the art that these transistors could be eliminated if the high impedance tri-state mode of operation is now required. From the foregoing detailed description, it can thus be seen that the present invention provides improved output buffer circuits formed of a first pull-down transistor and a second pull-down transistor for reducing significantly ground bounce noise. This performance is achieved by delaying the turn-on of the second pull-down transistor until the output has reached the low level.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:
1. An output buffer for providing an output signal at an output node which has a significant reduction in ground bounce noise, comprising:
   pull-up circuit means responsive to a first control signal for generating slowly a transition from a low logic level to a high logic level at the output node;
   said pull-up circuit means including a pull-up transistor having one of its main electrodes coupled to a first power supply terminal, its other main electrode coupled to the output node, and its control electrode coupled to receive the first control signal;
   pull-down circuit means responsive to second and third control signals for generating slowly a transition from the high logic level to the low logic level at the output node;
   said pull-down circuit means including a first pull-down transistor having one of its main electrodes coupled to a second power supply terminal, its other main electrode coupled to the output node, and its control electrode coupled to receive the second control signal;
   said pull-down circuit means further including a second pull-down transistor having one of its main electrodes coupled to the second power supply terminal, its other main electrode coupled to the output node, and its control electrode coupled to receive the third control signal;
   first logic means responsive to a data input signal making a low-to-high transition and the output signal making a low-to-high transition for generating the first control signal;
   second logic means responsive to the data input signal making a high-to-low transition and the output signal making a high-to-low transition for generating the second control signal; and
   third logic means responsive to the data input signal making the high-to-low transition and the output signal making the high-to-low transition for maintaining the second pull-down transistor turned-off until after the output node has made the high-to-low transition, thereby reducing significantly the ground bounce noise.

2. An output buffer as claimed in claim 1, wherein said pull-up transistor is an N-channel field-effect transistor N1.

3. An output buffer as claimed in claim 2, wherein said first and second pull-down transistors are N-channel field-effect transistors N3, N8.

4. An output buffer as claimed in claim 1, wherein said pull-up transistor is a p-channel, field-effect transistor P1.

5. An output buffer as claimed in claim 4, wherein said first and second pull-down transistors are N-channel field-effect transistors N3, N8.

6. An output buffer as claimed in claim 3, wherein said first logic means comprises a first NOR logic gate 13 having a first input coupled to the data input signal, a second input coupled to the output signal, and an output; a first N-channel control transistor N5 having its drain coupled to the first power supply terminal 24 its source coupled to the gate of the pull-up transistor N1, and its gate coupled to the output of said first NOR gate 13; and a second NOR logic gate 12 having first and second inputs coupled to the data input signal and an output also coupled to the gate of said pull-up transistor N1.

7. An output buffer as claimed in claim 6, wherein said second logic means comprises an AND logic gate 17 ving a first input coupled to the output signal, a second input coupled to the data input signal, and an output; a second N-channel control transistor N7 having its drain coupled to the output node, its source coupled to the gate of said first pull-down transistor N3, and its gate coupled to the output of said AND logic gate 17; and a third NOR logic gate 14 having first and second inputs coupled to the data input signal and an also coupled to the gate of said first pull-down transistor N3.

8. An output buffer as claimed in claim 7, wherein said third logic means comprises a fourth NOR logic gate 15 having a first input coupled to the output signal, a second input coupled to the data input signal, and an output coupled to the gate of said second pull-down transistor N8.

9. An output buffer as claimed in claim 3, wherein the size of said first pull-down transistor N3 is equal in size to said pull-up transistor N1 and the size of said second pull-down transistor N8 is equal or larger in size than said pull-down transistor N3.

10. An output buffer as claimed in claim 5, wherein the size of said first pull-down transistor N3 is smaller in size than said pull-up transistor P1 and the size of said second pull-down transistor N8 is equal or larger in size than said pull-down transistor N3.

11. An output buffer as claimed in claim 5, wherein said first logic means comprises a first NOR logic gate 13 having a first input coupled to the data input signal, a second input coupled to the output signal, and an output; a first N-channel control transistor N5 having its source coupled to the output node A, its drain coupled to the gate of the pull-up transistor P1, gate coupled to the output of said first NOR gate 13; and a NAND logic gate 12b having first and second inputs coupled to the data input signal and an output also coupled to the gate of said pull-up transistor P1.

12. An output buffer as claimed in claim 11, wherein said second logic means comprises an AND logic gate 17 having a first input coupled to the output signal, a second input coupled to the data input signal, and an output; a second N-channel control transistor N7 having its drain coupled to the output node, its source coupled to the gate of said first pull-down transistor N3, and its gate coupled to the output of said AND logic gate 17; and a second NOR logic gate 14 having first and second inputs coupled to the data input signal and an output also coupled to the gate of said first pull-down transistor N3.

13. An output buffer as claimed in claim 12, wherein said third logic means comprises a third NOR logic gate 15 having a first input coupled to the output signal, a second input coupled to the data input signal, and an output coupled to the gate of said second pull-down transistor N8.

14. An output buffer for providing an output signal at an output node which has a significant reduction in ground bounce noise, comprising:
pull-up circuit means responsive to a first control signal for generating slowly a transition from a low logic level to a high logic level at the output node;
pull-down circuit means having first and second current paths respectively responsive to second and third control signals for generating slowly a transition from the high logic level to the low logic level at the output node;
first logic means responsive to a data input signal making a low-to-high transition and the output signal making a low-to-high transition for generating the first control signal;
second logic means responsive to the data input signal making a high-to-low transition and the output signal making a high-to-low transition for generating the second control signal; and
third logic means responsive to the data input signal making the high-to-low transition and the output signal making the high-to-low transition for generating the third control signal to maintain said second current path turned-off until after the output node has made the high-to-low transition, thereby reducing significantly the ground bounce noise.

15. An output buffer as claimed in claim 14, wherein said pull-up circuit means comprises and N-channel field-effect transistor N1.

16. An output buffer as claimed in claim 15, wherein said pull-down circuit means comprises N-channel field-effect transistors N3, N8.

17. An output buffer as claimed in claim 14, wherein said pull-up circuit means comprises a P-channel, field-effect transistor P1.

18. An output buffer as claimed in claim 17, wherein said pull-down circuit means comprises N-channel field-effect transistors N3, N8.

19. An output buffer as claime din claim 16, wherein the size of said transistor N3 is equal in size to said transistor N1 and the size of said transistor N8 is equal or larger in size than said transistor N3.

20. An output buffer as claimed in claim 18, wherein the size of said transistor N3 is smaller in size than said transistor P1 and the size of said transistor N8 is equal or larger in size than said transistor N3.

* * * * *